(12) United States Patent
Colburn

(10) Patent No.: US 7,439,628 B2
(45) Date of Patent: Oct. 21, 2008

(54) METHOD FOR IMPROVED PROCESS LATITUDE BY ELONGATED VIA INTEGRATION

(75) Inventor: Matthew E. Colburn, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 110 days.

(21) Appl. No.: 11/474,420

(22) Filed: Jun. 26, 2006

(65) Prior Publication Data

US 2006/0244146 A1    Nov. 2, 2006

Related U.S. Application Data

(62) Division of application No. 10/887,086, filed on Jul. 9, 2004, now Pat. No. 7,071,097.

(51) Int. Cl.
*H01L 23/48* (2006.01)
*H01L 23/52* (2006.01)

(52) U.S. Cl. ............... 257/774; 257/758; 257/E23.145

(58) Field of Classification Search ................. 257/758, 257/774, E23.145
See application file for complete search history.

(56) References Cited

U.S. PATENT DOCUMENTS

| | | | |
|---|---|---|---|
| 4,789,648 A | 12/1988 | Chow et al. | |
| 4,944,836 A | 7/1990 | Beyer et al. | |
| 5,897,349 A | 4/1999 | Agnello | |
| 6,331,237 B1 | 12/2001 | Andricacos et al. | |
| 6,348,299 B1 | 2/2002 | Aviram et al. | |
| 6,416,812 B1 | 7/2002 | Andricacos et al. | |
| 6,437,440 B1 | 8/2002 | Cabral, Jr. et al. | |
| 6,551,919 B2 | 4/2003 | Venkatesan et al. | |
| 6,800,571 B2 | 10/2004 | Cheung et al. | |
| 6,849,888 B2 * | 2/2005 | Ooishi | 257/295 |
| 2001/0023991 A1 | 9/2001 | Kakuhara | |
| 2002/0092673 A1 | 7/2002 | Andricacos et al. | |
| 2002/0182855 A1 * | 12/2002 | Agarwala et al. | 438/638 |
| 2003/0045093 A1 | 3/2003 | Givens et al. | |
| 2003/0201537 A1 | 10/2003 | Lane et al. | |

* cited by examiner

*Primary Examiner*—Nitin Parekh
(74) *Attorney, Agent, or Firm*—Connolly Bove Lodge & Hutz LLP

(57) ABSTRACT

Interconnect dual damascene structure are fabricated by depositing on a layer of at least one dielectric, a mask forming layer for providing the via-level mask layer of the dual damascene structures; creating an elongated via pattern in the via-level mask layer; depositing a layer of line-level dielectric and creating a line pattern through the layer of line-level dielectric, and transferring the line pattern through the projected intersection of the elongated via-level pattern and of the line-level pattern thereby generating an aligned dual damascene structure. A conductive liner layer is deposited in the dual damascene structure followed by filling the dual damascene structure with a conductive fill metal to form a set of metal lines. The metal and liner layers are planarized.

7 Claims, 8 Drawing Sheets

(Cross-section A-A)

(Cross-section B-B)

METHOD FOR IMPROVED PROCESS LATITUDE BY ELONGATED VIA INTEGRATION

This application is a Divisional Application of U.S. application Ser. No. 10/887,086, filed Jul. 9, 2004, and now U.S. Pat. No. 7,071,097.

FIELD OF THE INVENTION

The present invention pertains to the process of producing intralayer and interlayer structures in Very-Large Scale Integrated (VLSI) and Ultra-Large Scale Integrated (ULSI) devices and high performance packaging. More particularly, the present invention relates to fabricating interconnect dual damascene structures.

BACKGROUND OF THE INVENTION

The fabrication of Very-Large Scale Integrated (VLSI) or Ultra-Large Scale Integrated circuit (ULSI) requires metallic wiring that connects individual devices in a semiconductor chip, to one another. One method of creating this wiring network on such a small scale is the dual damascene (DD) process schematically shown in FIG. 1. In the standard DD process, an interlayer dielectric (ILD), shown as two layers 110, 120 is coated on the substrate 100, FIG. 1a. The via level dielectric 110 and the line level dielectric 120 are shown separately for clarity of the process flow description. In general, these two layers can be made of the same or different insulating films and in the former case applied as a single monolithic layer.

A hard mask layer 130 is optionally employed to facilitate etch selectivity and to serve as a polish stop in a subsequent fabrication step. The wiring interconnect network includes two types of features: line features that traverse a distance across the chip, and the via features which connect together lines in different levels. Historically, both layers are made from an inorganic glass such as silicon dioxide ($SiO_2$) or a fluorinated silica film deposited, for instance, by plasma enhanced chemical vapor deposition (PECVD).

In the dual damascene process, the position of the lines 150 and the vias 170 are defined lithographically in photoresist layer, 140, depicted in FIGS. 1b and 1d, and transferred into the hard mask, 130 and ILD layers, 110 and 120, using reactive ion etching processes. The process sequence shown in FIG. 1 is called a Line-first approach because the trench 160 which will subsequently house the line feature is etched first, see FIG. 1c.

After the trench formation, lithography is used to define a via pattern 170 in the photoresist layer 140 which is transferred into the dielectric material, 110, to generate a via opening 180. See FIG. 1d.

The dual damascene trench and via structure 190 is shown in FIG. 1e after the photoresist has been stripped. This structure 190 is coated with a conducting liner or material or material stack 200 that serves as an adhesion layer between the conductor and the ILD. This recess is then filled with a conducting fill material 210 over the surface of the patterned substrate. The fill is most commonly accomplished by electroplating of copper although other methods such as chemical vapor deposition (CVD) and other materials such as Al, Ag or Au and alloys thereof can also be used. The fill, 210, and liner, 200 materials are then chemically-mechanically polished (CMP) to be coplanar with the surface of the hard mask, 130, and the structure at this stage is shown in FIG. 1f. A capping material 220 can be deposited over the metal or as a blanket film, as is depicted in FIG. 1g to passivate the exposed metal surface and to serve as a diffusion barrier between the metal and any additional ILD layers to be deposited over them. Silicon nitride, silicon carbide, and silicon carbonitride films deposited by PECVD are typically used as the capping material 220. This process sequence is repeated for each level of the interconnect on the device. Since two interconnect features are defined to form a conductor in-lay within an insulator by a single polish step, this process is designated a dual damascene process.

In order to improve performance, the semiconductor industry has shrunk the gate length and as a result the chip size. As a consequence the interconnect structure that forms the metallic circuitry has also shrunk. Traditionally, the via levels are one of the most challenging to print with a high process latitude. In order to improve the manufacturability of the lithography step, advanced masks that incorporate phase-shifting, resolution enhancing techniques and optical proximity correction have been employed. Nevertheless, continuing efforts are underway to develop further improved interconnect fabrication techniques.

SUMMARY OF THE INVENTION

The present invention relates to the fabrication of an interconnect structure utilizing an advantageous sequence that allows for the elimination of some of the constraints on the via level patterning. The present invention is applicable to any two pattern levels that when spatially overlaided, their intersection produce the desired via opening.

The fabrication method of the present invention relates to providing a interconnect dual damascene structure. The process comprises the following:
 a) providing a layer of at least one dielectric on a substrate surface;
 b) depositing on the layer of the at least one dielectric, a mask forming layer for providing a via-level mask layer;
 c) creating an elongated via pattern in the via-level mask layer;
 d) depositing a layer of line-level dielectric;
 e) creating a line pattern through the layer of line-level dielectric;
 f) transferring the line pattern through the projected intersection of the elongated via-level pattern and of the line level pattern to generate an aligned dual damascene structure;
 g) depositing a conductive liner layer and then filling the dual damascene structure with a conductive fill metal to form a set of metal lines;
 h) planarizing the metal and liner layers so that the metal is coplanar with the top of layer of at least one dielectric on the substrate surface.

The present invention also relates to interconnect structures obtained by the above disclosed process.

A further aspect of the present invention relates to an interconnect dual damascene structure which comprises an aligned dual damascene pattern of a line level pattern and an elongated via-level pattern; a conductive liner layer and conductive fill metal in the aligned dual damascene pattern forming a set of metal lines; and wherein the conductive liner layer and metal are coplanar with the top layer of the damascene pattern.

The foregoing and other objects, features and advantages of the invention as well as presently preferred embodiments thereof and the best known techniques for fabricating integrated circuit structure in accordance with the invention will

BEST AND VARIOUS MODES FOR CARRYING OUT INVENTION

In order to facilitate a further understanding of the present invention, reference will be made to the Figures.

Figure 1A:
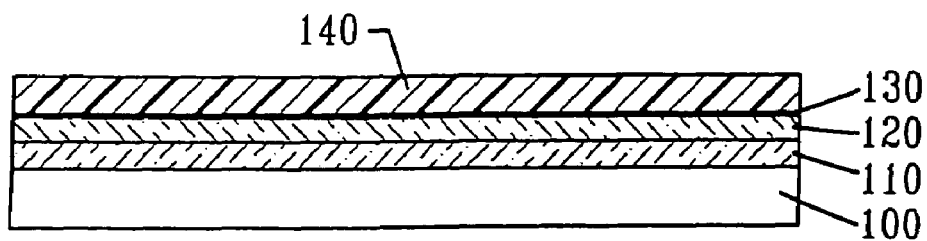
FIGS. 1a-1g are schematic views of the steps in a conventional Dual Damascene (DD) Process.
Figure 1B:
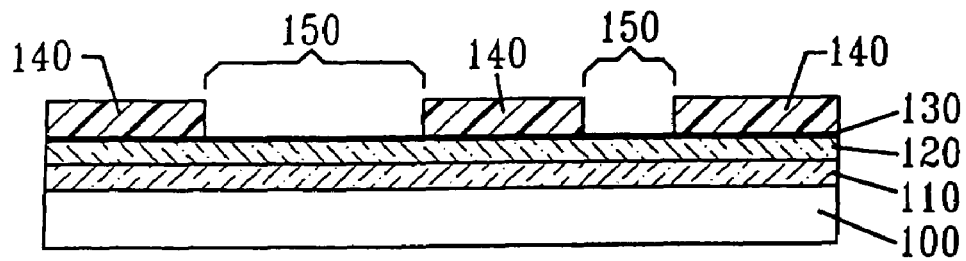
Figure 1C:
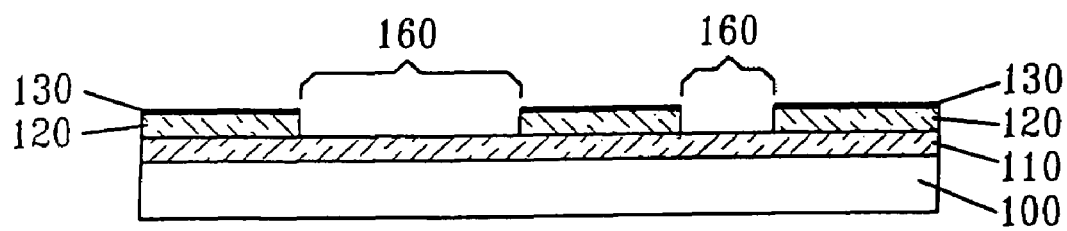
Figure 1D:
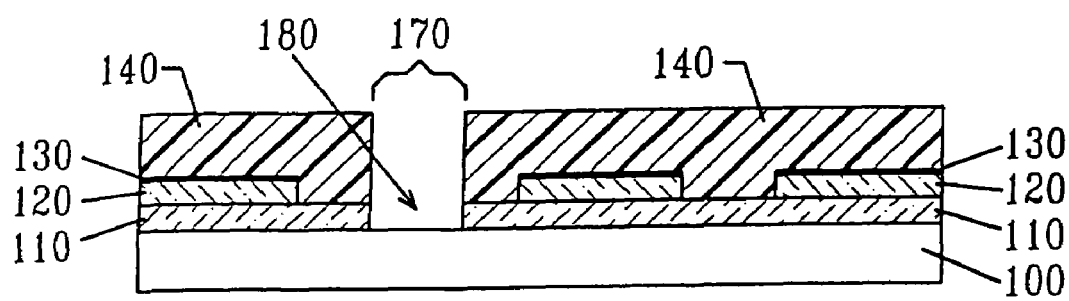
Figure 1E:
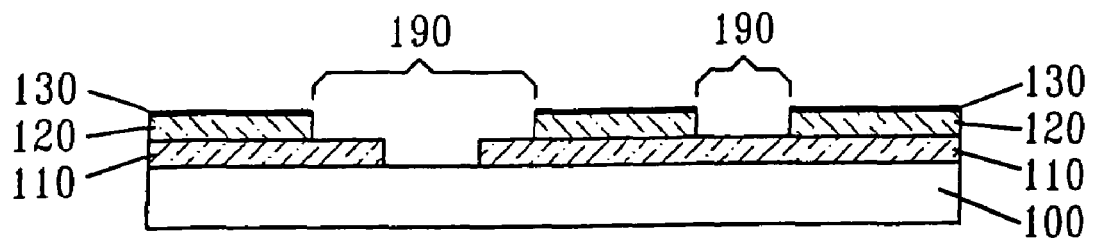
Figure 1F:
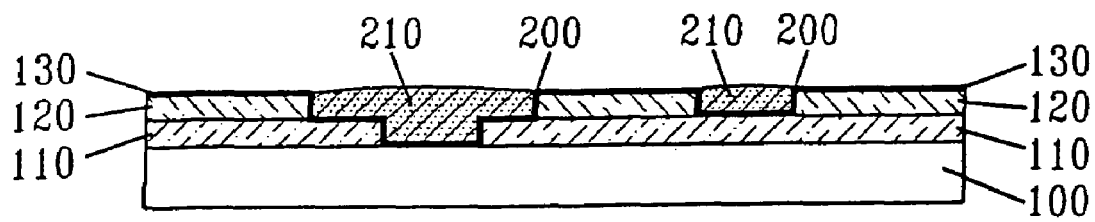
Figure 1G:
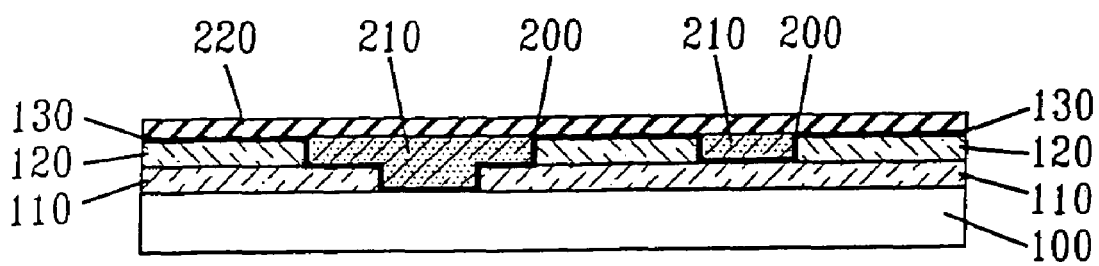
Figure 2A:
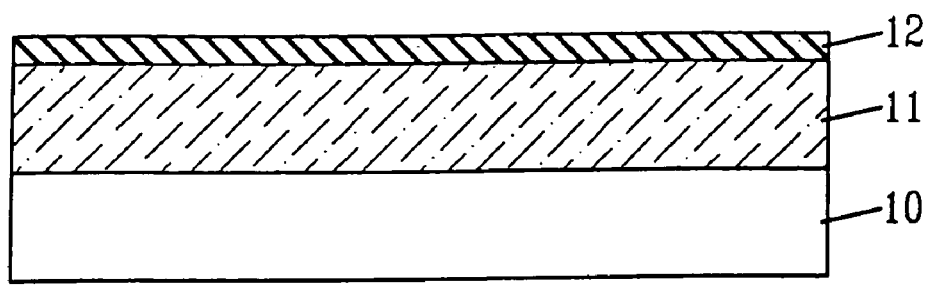
FIGS. 2a-2f are schematic views of the steps used to implement a Dual Damascene Process with improved process latitude at the via level according to the present invention.

Reference to FIG. 2a shows coating a substrate 10 with a via-level dielectric 11 and a via-level mask 12. Typical insulating or dielectric material 11 include silicon dioxide ($SiO_2$) phosphosilicate glass (PSG), boron doped PSG (BDPSG) or tetraethylorthosilicate (TEOS), and more typically low-k dielectrics having a dielectric constant of less than 3.9 such as SILK (available from Dow Chemical), SiCH (available from AMAT under the trade designation BLOK), SiCOH (available from Novellus under the trade designation Coral, from AMAT under the trade designation Black Diamond and from ASM under the trade designation Auora), SiCHN (available from IBM under the trade designation N Blok), CVD carbon-doped oxide, porous CVD carbon-doped oxide, porous and non-porous organo silicates, porous and non-porous organic spin-on polymers.

Figure 2B:
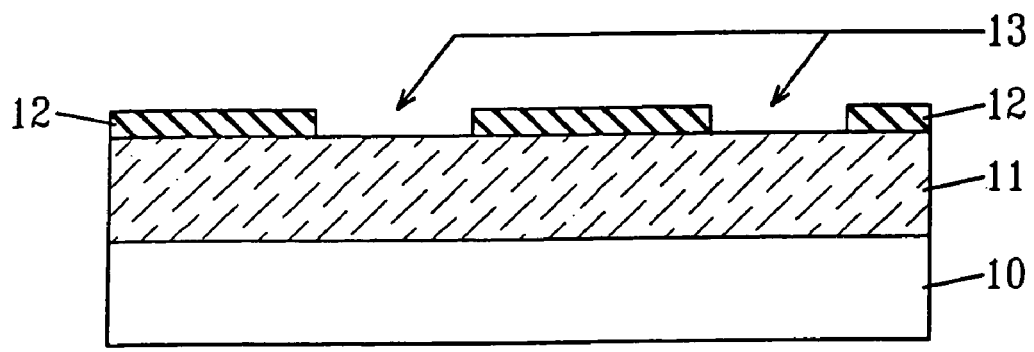

The via-level mask 12 is typically a hard mask material such as silicon nitride, N Blok, Blok, Coral, Black Diamond, SiCOH, or an organic mask such as FFO2 from Honeywell. The via-level mask may optionally be a multilayered stack of the hard mask materials. The via-level mask is patterned using conventional techniques such as reactive ion etching (RIE). The pattern 13 according to the present invention is an elongated via pattern. The via pattern is elongated orthogonally relative to the subsequent to be formed line-level pattern. The pattern 13 is typically elongated to at least about 10% of the desired line spacing. The pattern 13 is typically elongated to less than ½ the desired line spacing. Preferably pattern 13 is elongated from about 10% to less than ½ the desired line spacing. See FIG. 2b. The minimum elongation is typically determined not by the desired line spacing but by the overlay tolerance with the subsequent pattern is placed.

Figure 2C:
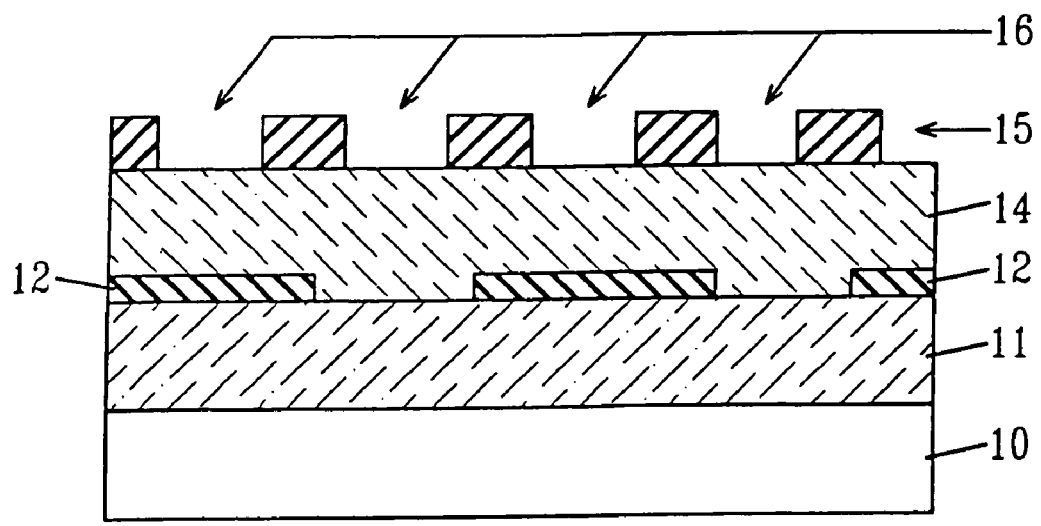

Next a layer 14 of line-level dielectric is deposited in pattern 13 on top of patterned mask 12. See FIG. 2c. The line-level dielectric layer 14 is typically any of the dielectrics disclosed above for the via-level dielectric 11. A mask layer 15 such as a hardmask or hardmask stack is coated on the line-level dielectric and is patterned with a conventional line-level pattern 16.

Suitable hardmask materials are tailored by the particular dielectric materials used in constructing the structure and can be determined by those skilled in the art without undue experimentation once aware of this disclosure. For example, when employing Silk, the hardmasks can comprise SiCOH, Blok, $SiO_2$, NBlok, $Si_3N_4$, and spin-on silsesquioxanes. For SiCOH based structures, the hardmasks comprises BLOK, RESIST, $SiO_2$, N BLOK, SiCOH of lower porosity or chemical composition, FSG and TEOS. The mask layer 15 can be etched by reactive ion etching for instance.

Figure 2D:
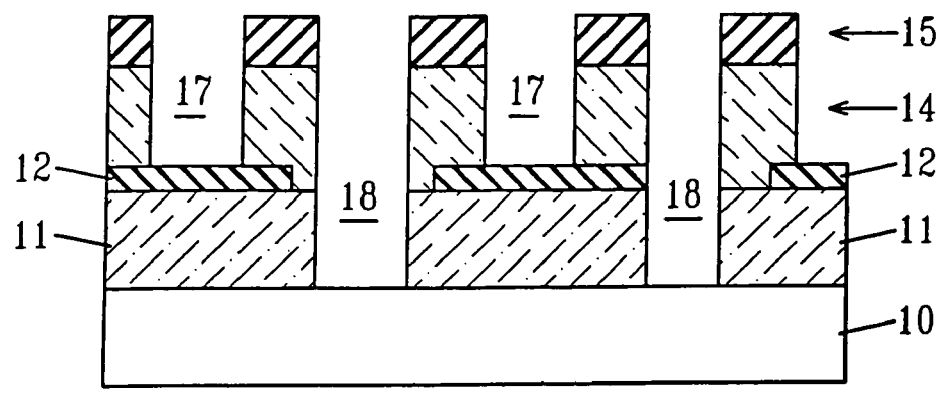

The dielectric layer 14 is anisotropically etched to transfer the line-level dielectric to form the troughs 17 as shown in FIG. 2d.

In addition, where the elongated via patterns is opened in the via-level mask, the etch progresses to the bottom of the via-level dielectric 10 generating the via 18 as shown in FIG. 2d.

Figure 2E:
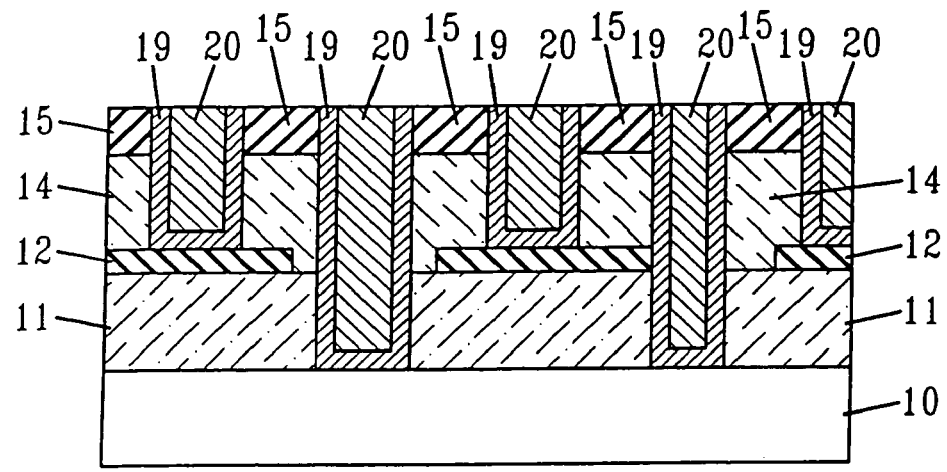

Subsequent conventional metallization and polishing generates the dual damascene interconnect structure containing the liner 19 and the inlaid conductive material 20 as shown in FIG. 2e.

Typical barrier layers 19 are tungsten, titanium, tantalum, nitrides thereof and alloys thereof. Also, the barrier layer can include two ore more layers (e.g.—W/Wn bilayer). The preferred barrier layer comprises tungsten. The barrier layer 19 is typically deposited by chemical vapor deposition (CVD) or by sputtering such as physical vapor deposition (PVD) or ionized physical vapor deposition (IPVD).

A further example of suitable barrier material is disclosed in U.S. Pat. No. 6,437,440 B1 to Cabral, Jr. et al.

Typical conductive lines 20 are Cu, Al, Ag, Au and alloys thereof, and more typically Cu and Cu alloys.

The conductive line material can be deposited by these processes known in the art. When material 20 comprises copper and alloys thereof, the preferred deposition technique is electroplating such as those disclosed in U.S. Ser. No. 09/348,632 and U.S. Pat. No. 6,331,237 B1 to Andricacos et al.

Figure 2F:
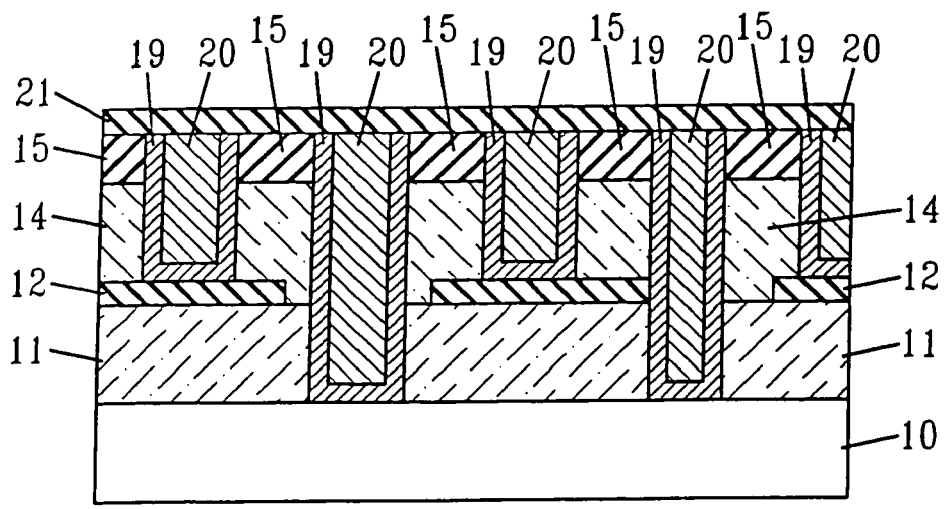
Figure 3A:
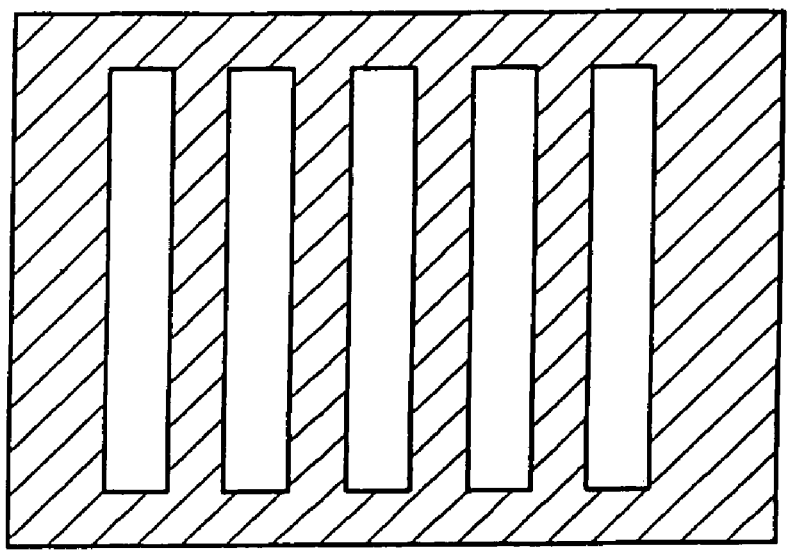
FIGS. 3a-3d are schematic views of via narrowing problem occurring with a conventional Dual Damascene Process.
Figure 3B:
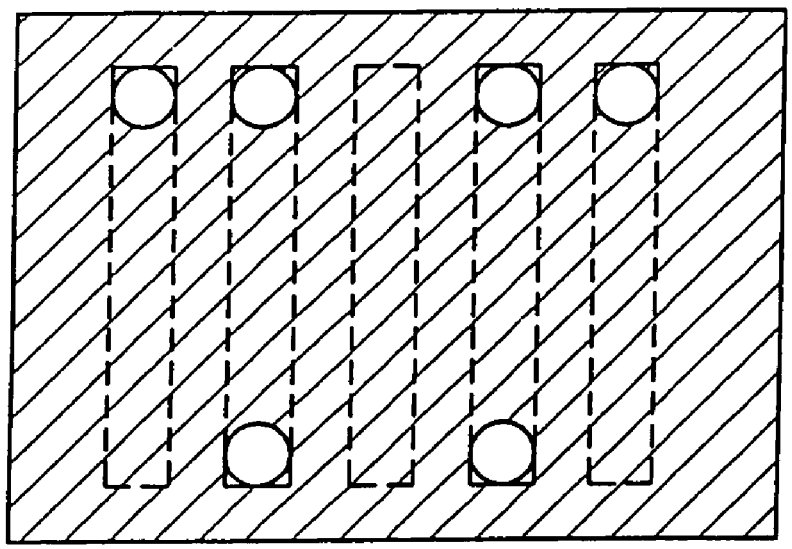
Figure 3C:
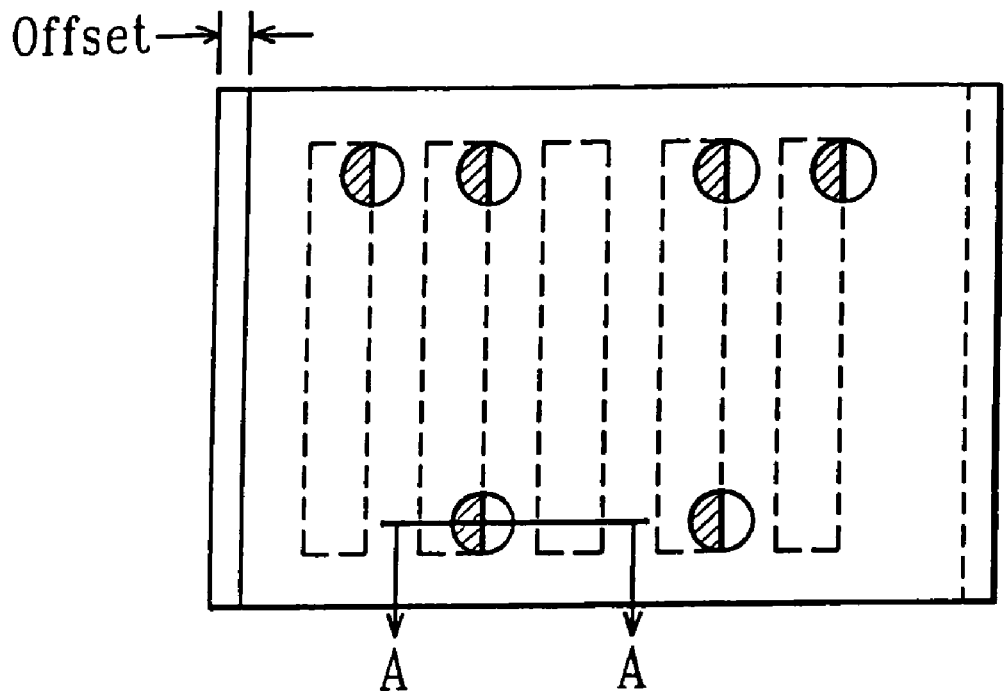
Figure 3D:
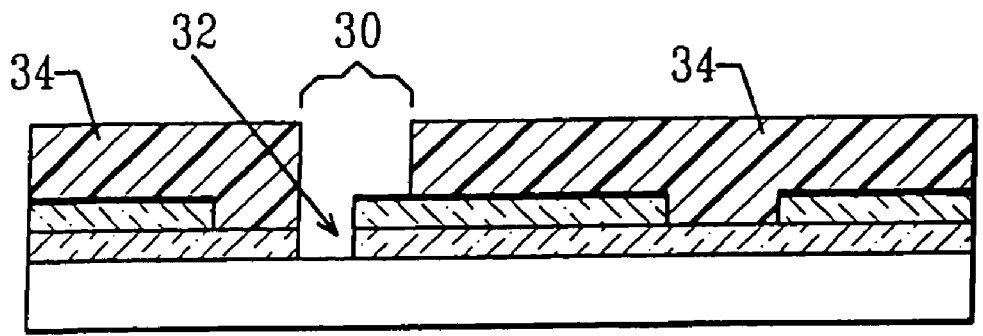

Next, the dual damascene structure is capped with a electromigration and diffusion barrier 21 shown in FIG. 2f as a continuous dielectric cap. Silicon nitride, silicon carbide, and silicon carbonitride films deposited by PECVD are typically used as the capping material 220.

One problem addressed with this integration strategy of the present invention is illustrated in FIG. 3. A representative line-level pattern containing parallel line is shown in FIG. 3a. A representative via-level pattern is shown in FIG. 3b with an aligned line-level pattern overlaid in the dashed line. The problem addressed in this patent is illustrated in FIG. 3c, where the via-level pattern is offset from the line-level pattern illustrated in dashed line. Either via narrowing represented in FIG. 3d or line narrowing (not illustrated) will occur. In FIG. 3d, the via pattern 30 in the resist 34 is offset from the line pattern resulting in the via narrowing 32. This adversely affects the via resistance by decreasing the cross-section through which the current must flow. Conversely, in the non-illustrated example of line narrowing, the breakdown voltage will be adversely affected since two adjacent lines will have a narrowed spacing; effectively increasing the electric field at the location of the vias.

Figure 4A:
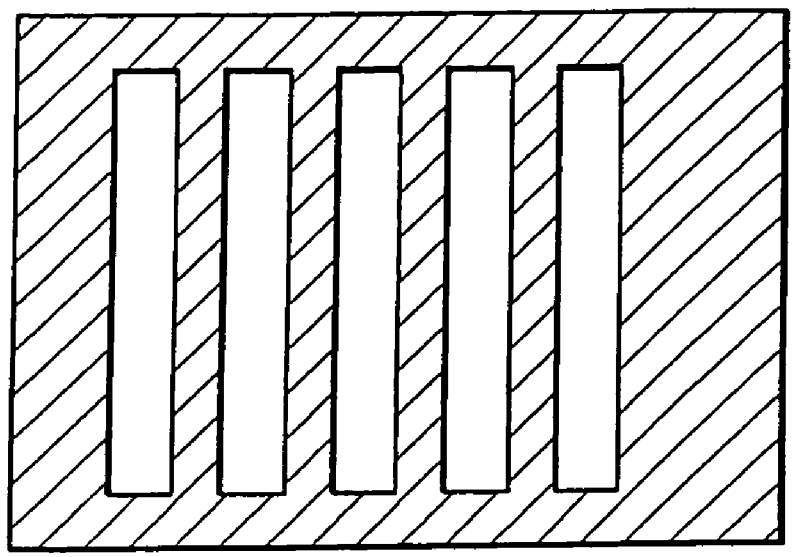
FIGS. 4a-4d are schematic views for addressing via narrowing according to the present invention.
Figure 4B:
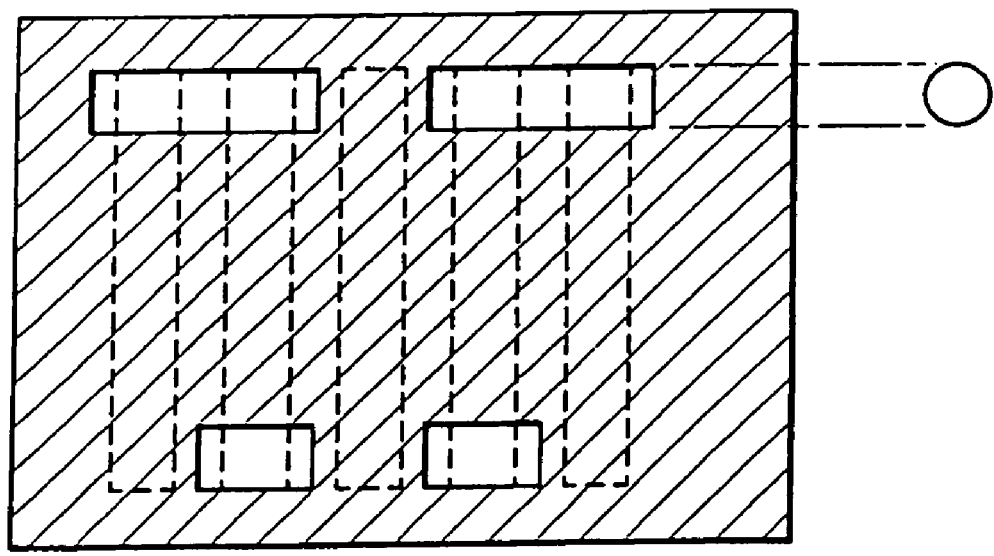
Figure 4C:
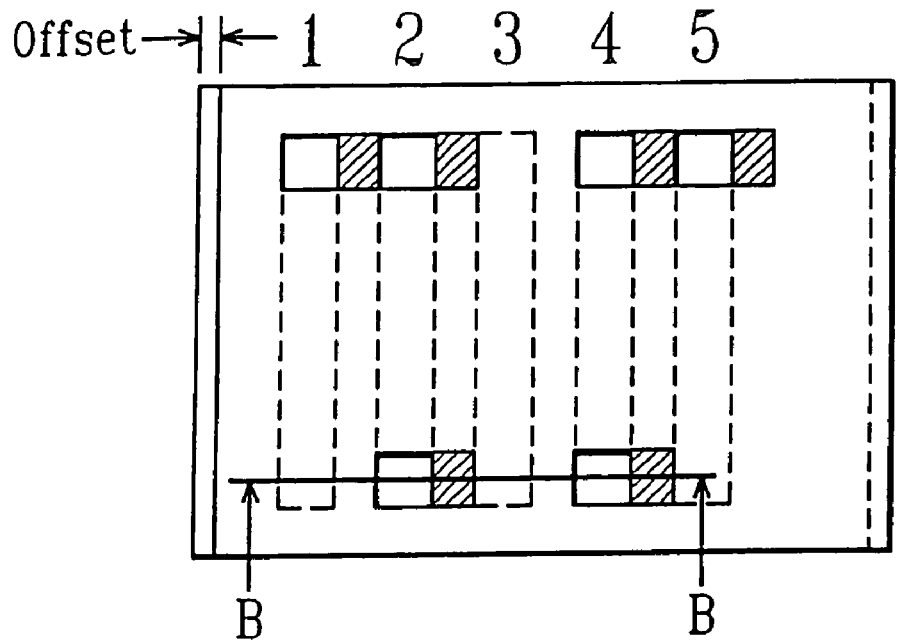
Figure 4D:
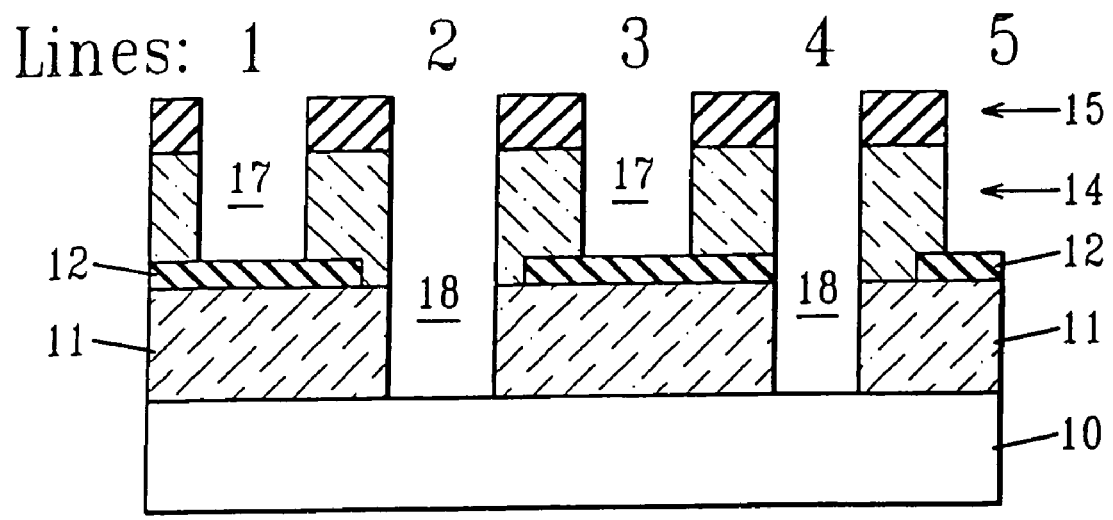

In addition, the integration strategy shown in FIG. 2 may be adopted that allows for the via-alignment constraint to be relaxed. In the process flow described in FIG. 2, the via reticle (FIG. 4b) is designed such that the vertical intersection of the printed via pattern and the printed line pattern equates to the desired via pattern. Since the line patterns on most chips are mostly parallel to one another as shown in FIG. 4a, a via pattern that is elongated orthogonal (FIG. 4b) to the line pattern and to length of less than ½ the line width will meet the new constraint that vertical projected intersection of the two patterns result in the "perfect" alignment of the via within the width of the line thus negating via narrowing and/or line width spacing as shown in FIG. 4b. This integration (including the reticle design) allows for via-to-line misalignment to be accommodated without adversely affecting the result as is shown in FIG. 4c. A cross-section view of the B-B section in FIG. 4c is shown in FIG. 4d where the trough 17 and the via 18 are shown with respect to the via-level dielectric 11, via level mask 12 with elongated via pattern 13, the line level dielectric 14 and hardmask 15.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the invention concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

All publications and patent applications cited in this specification are herein incorporated by reference, and for any and all purposes, as if each individual publication or patent application were specifically and individually indicated to be incorporated by reference.

The invention claimed is:

1. An interconnect structure comprising an aligned dual damascene pattern of a line level pattern and an elongated via-level pattern;
   a conductive liner layer and conductive fill metal in the aligned dual damascene pattern forming a set of metal lines;
   and wherein the conductive liner layer and metal are coplanar with the top layer of the damascene pattern, and
   wherein said elongated
   via pattern is elongated in the orthogonal direction to said line level pattern; and
   wherein said dual damascene structure is self aligned in said orthogonal direction.

2. The interconnect structure of claim 1, which further comprises mask-forming layers that are hardmask materials.

3. The interconnect structure of claim 1, wherein the elongated via pattern is elongated by at least 10% of the line-to-line spacing.

4. The interconnect structure of claim 1, wherein the elongated via pattern is elongated by less than ½ the line-to-line spacing.

5. The interconnect structure of claim 1, wherein the elongated via pattern is elongated from about 10% to less than ½ the line-to-line spacing.

6. The interconnect structure of claim 1, wherein the conductive fill material comprises Cu or Ag alloy.

7. The interconnect structure of claim 1, which further comprises a capping layer.

* * * * *